(12) United States Patent
Kramer et al.

(10) Patent No.: US 6,385,055 B1
(45) Date of Patent: May 7, 2002

(54) HINGED ELECTRICAL SHIELDING FOR COMMUNICATION DEVICE

(75) Inventors: Michael Joseph Kramer, Lawrenceville; Alan J. Schlenz; Michael Patrick Duggan, both of Snellville, all of GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/733,403

(22) Filed: Dec. 8, 2000

(51) Int. Cl.[7] .................................................. H05K 9/00
(52) U.S. Cl. ........................ 361/816; 361/752; 361/753; 361/818; 174/35 R
(58) Field of Search ................................. 361/816, 796, 361/797, 800, 829, 714, 724, 730, 752, 728, 742, 753, 799, 818; 174/35 R; 220/4.02; 211/41.17; 333/12

(56) References Cited

U.S. PATENT DOCUMENTS

| | | | |
|---|---|---|---|
| 5,398,169 A | * | 3/1995 | Gorenz, Jr. et al. ......... 361/818 |
| 5,432,676 A | * | 7/1995 | Satoh et al. ................. 361/752 |
| 5,437,367 A | * | 8/1995 | Martin ........................ 206/320 |
| 5,764,492 A | * | 6/1998 | Ady et al. ................... 361/818 |

* cited by examiner

*Primary Examiner*—Jeffrey Gaffin
*Assistant Examiner*—Hung Bui
(74) *Attorney, Agent, or Firm*—Hubert J. Barnhardt, III; Kenneth M. Massaroni; Shelley L. Couturier

(57) ABSTRACT

An electronic module that includes a housing and electronics that has a divider (215) that is substantially conductive, rectangular, and planar. The divider (215) is hingeably coupled to the housing with hinges (225). The divider (215) defines an upper section (210) and a lower section (205) within the housing, wherein the divider (215), in an open position, allows access to electronics (223) within the lower section (205), and the divider (215), in a closed position, allows access to electronics (223) within the upper section (210). The divider (215), in the closed position, provides electromagnetic shielding between the electronics (223) in the upper section (210) and the electronics (223) in the lower section (205).

7 Claims, 4 Drawing Sheets

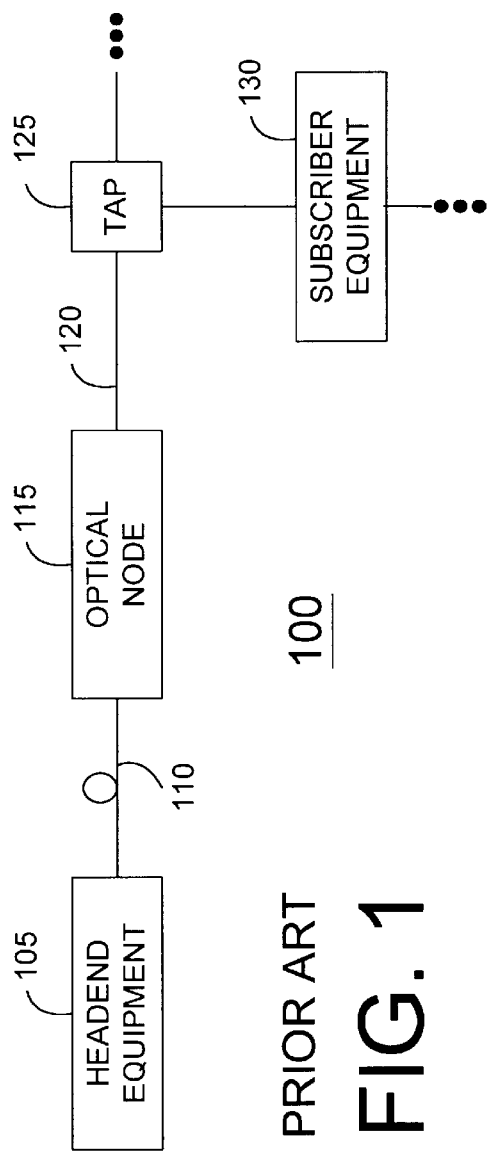
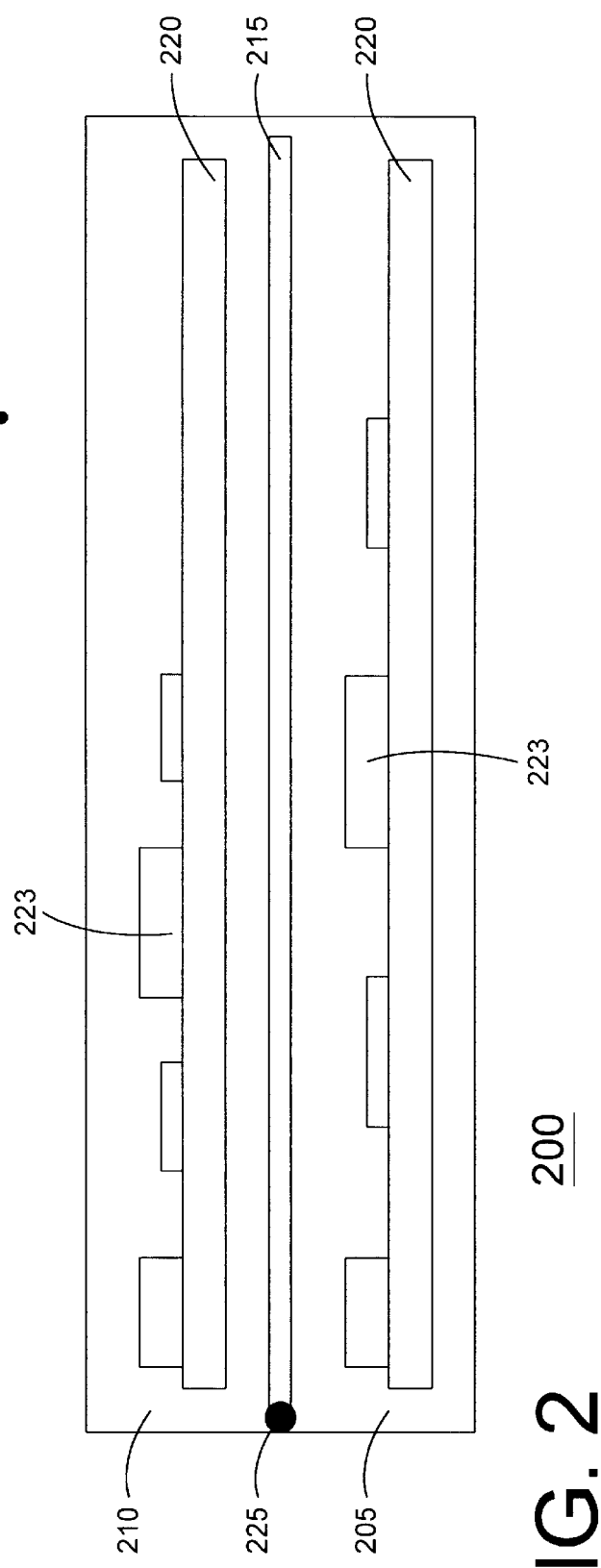
PRIOR ART
FIG. 1
FIG. 2

HINGED ELECTRICAL SHIELDING FOR COMMUNICATION DEVICE

FIELD OF THE INVENTION

This invention relates generally to broadband communications systems, such as cable television systems and the electrical equipment used in such systems, and more specifically to shielding for use in such systems.

BACKGROUND OF THE INVENTION

Communication systems, such as a cable television system, generally interconnect a large number of electronic components for signal transmission and reception. Such components may include, for example, broadband headend equipment, node equipment, hub equipment, and other devices for performing signal operations. Typically, the electronic equipment includes modules that are mounted within a chassis so that cables coupled to a particular module can be routed to one or more other modules that may be mounted within the same chassis or a different chassis.

Conventional electronic modules typically include a motherboard with daughterboards attached thereto. Disadvantages associated with the configuration and assembly of the motherboard and daughterboards include the difficulties with servicing certain sections. For example, in some circumstances, the whole module may have to be disassembled to repair or replace a small section of the motherboard. The difficulties with servicing may also affect any field upgrades that are performed on the module. More specifically, it may be difficult to modify a module without disassembling all the boards. Another disadvantage with the configuration of the boards may be noise that is present within the module as a result of a lack of adequate electromagnetic interference (EMI) shielding.

A primary aim of the manufacturers is to provide cable television system electronic devices that transmit high quality signals to each subscriber on the network by focusing on the optimum configuration of components and boards and, additionally, properly shielding the components and boards for protection from EMI within electronic devices. It is also very important to minimize the cost of manufacturing the product, such as the component, module, and chassis costs. Additionally, streamlining the manufacturing processes, as well as minimizing the time spent on repair and service of electronic devices, will also contribute to decreased costs associated with the manufacture and use of the electronic devices.

Thus, in summary, what is needed is an electronic device that minimizes costs associated with the product and additionally allows an operator to use, service, and upgrade the module with ease.

BRIEF DESCRIPTION OF THE DRAWINGS

FIG. 1 depicts a communications system, such as a cable television system.

FIG. 2 depicts a cut out view of an electronic device including a hinged divider in the seated position in accordance with the present invention.

DETAILED DESCRIPTION OF A PREFERRED EMBODIMENT

Figure 3:
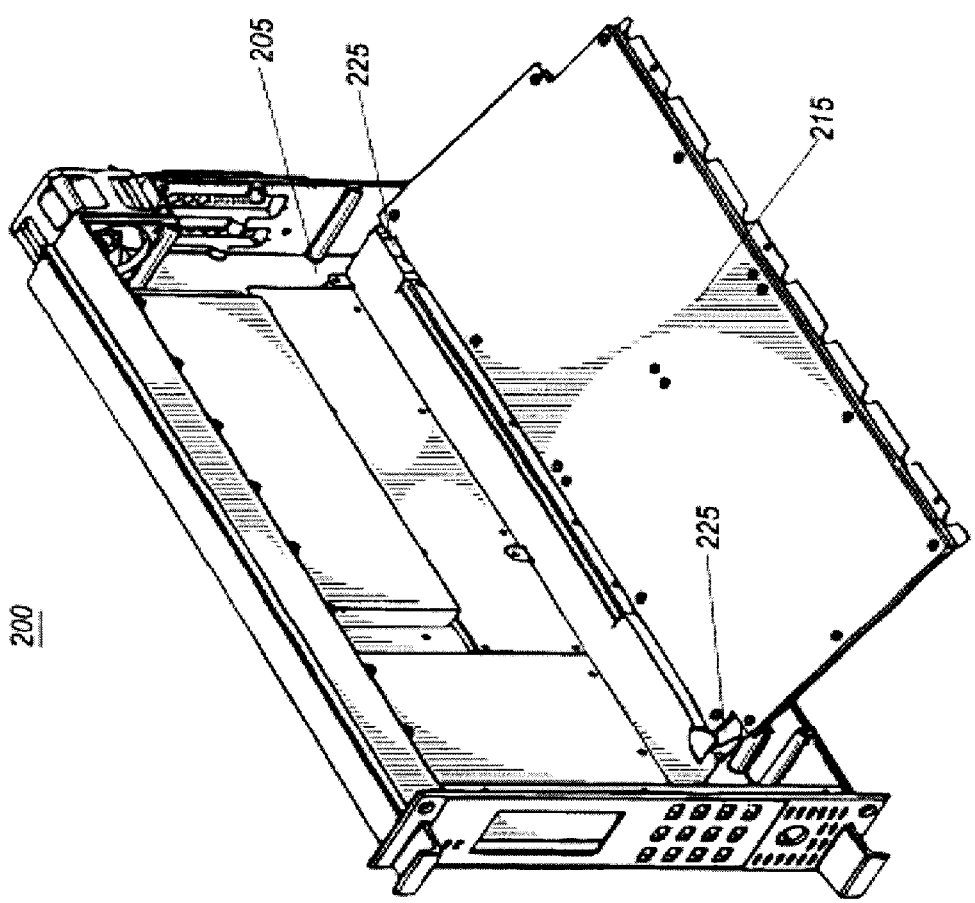
FIG. 3 depicts a view of an electronic device including the shielded divider of FIG. 2 pivoted to the open position in accordance with the present invention.

FIG. 1 shows a communications system 100, such as a cable television system, having both forward and reverse paths, i.e., having the ability to communicate downstream in the forward direction and upstream in the reverse direction. The cable television system 100 includes a headend 105 for receiving satellite signals that are demodulated to baseband or an intermediate frequency (IF). The baseband signal is then converted to cable television signals that are routed throughout the system 100 to subscriber equipment 130, such as set top decoders, televisions, or computers, located in the residences or offices of system subscribers. The headend 105 can, for instance, convert the baseband signal to an optical signal that is transmitted over fiber optic cable 110, in which case a remotely located optical node 115 converts the optical signal to an electrical radio frequency (RF) signal for further transmission through the system 100 over coaxial cable 120. Taps 125 located along the cable 120 at various points in the distribution system split off portions of the RF signal for routing to subscriber equipment 130 coupled to subscriber drops provided at the taps 125.

The system 100, as mentioned, also has reverse transmission capability so that signals, such as data, video, or voice signals, generated by the subscriber equipment 130 can be provided back to the headend 105 for processing. The reverse signals travel through the taps 125 and any nodes 115 and other cable television equipment, e.g., reverse amplifiers, to the headend 105. In the configuration shown in FIG. 1, RF signals generated by the subscriber equipment 130 travel to the node 115, which converts the RF signals to optical signals for transmission over the fiber optic cable 110 to the headend 105.

Typically, included within the headend 105 are racks of modules for processing and transmitting the received signals from satellites. The modules include printed circuit boards (PCBs) and components that, typically, are densely packaged within a module. Consideration is given to the design of shielding and placement of all components and boards for EMI shielding; however, due to the shrinking sizes of all electronic devices, the components and boards cannot always be designed for easy repair, service, and upgrades.

FIG. 2 shows an electronic device 200, such as a headend module that can be situated within a headend rack, in accordance with the present invention. Within the module housing are essentially two tiered areas 205, 210, or a lower and an upper section of the housing. A shielded divider 215, which is essentially rectangular and planar in shape, included within the housing divides the space within the housing. The divider 215 is manufactured from material such as steel or metal-plated plastic. Printed circuit boards 220 or other components 223, such as transformers or connectors, are then be positioned and mounted below the divider 215 as well as physically mounted above or onto the divider. Advantageously, in addition to shielding between the upper section 210 and the lower section 205, the divider 215 also allows for more efficient use of space within the module, aids in servicing or upgrading the device 200, and decreases manufacturing costs of the device 200.

Referring to FIG. 3 in conjunction with FIG. 2, hinges 225 are attached along one end of the divider 215, thereby allowing the divider 215 to pivot to an open position, in which hinge stops prevent further rotation in the outward direction, and is discussed further below. In the open position, as shown in FIG. 3, access to electronics or any other components that are positioned in the lower section 205 of the module 200 is easily accomplished. More specifically, when required to access components that are positioned within the lower section 205 of the module 200, the divider 215 is pivoted, or rotated, and essentially moved from blocking, or obstructing, that section 205.

Referring again to FIG. 2, when the divider 215 is pivoted to the seated position, as shown, the lower section 205 of the device 200 is shielded from any signal noise or interference that may emanate from other components that are located in the upper section 210 of the module 200. It will be appreciated that if the divider 215 is excessively large or if heavier components are to be mounted onto the divider 215, supporting structures, such as standoffs, may be used on the side of the divider 215 opposite the hinges 225. When the divider 215 is in the seated position, printed circuit boards 220 can be positioned and mounted on the divider 215 itself, using such techniques as a nonconductive layer positioned between the divider 215 and the boards 220 along with molded plastic inserts or screwing the boards onto the divider 215, or in the upper section 210 of the device 200 that is above the divider 215.

Figure 4:
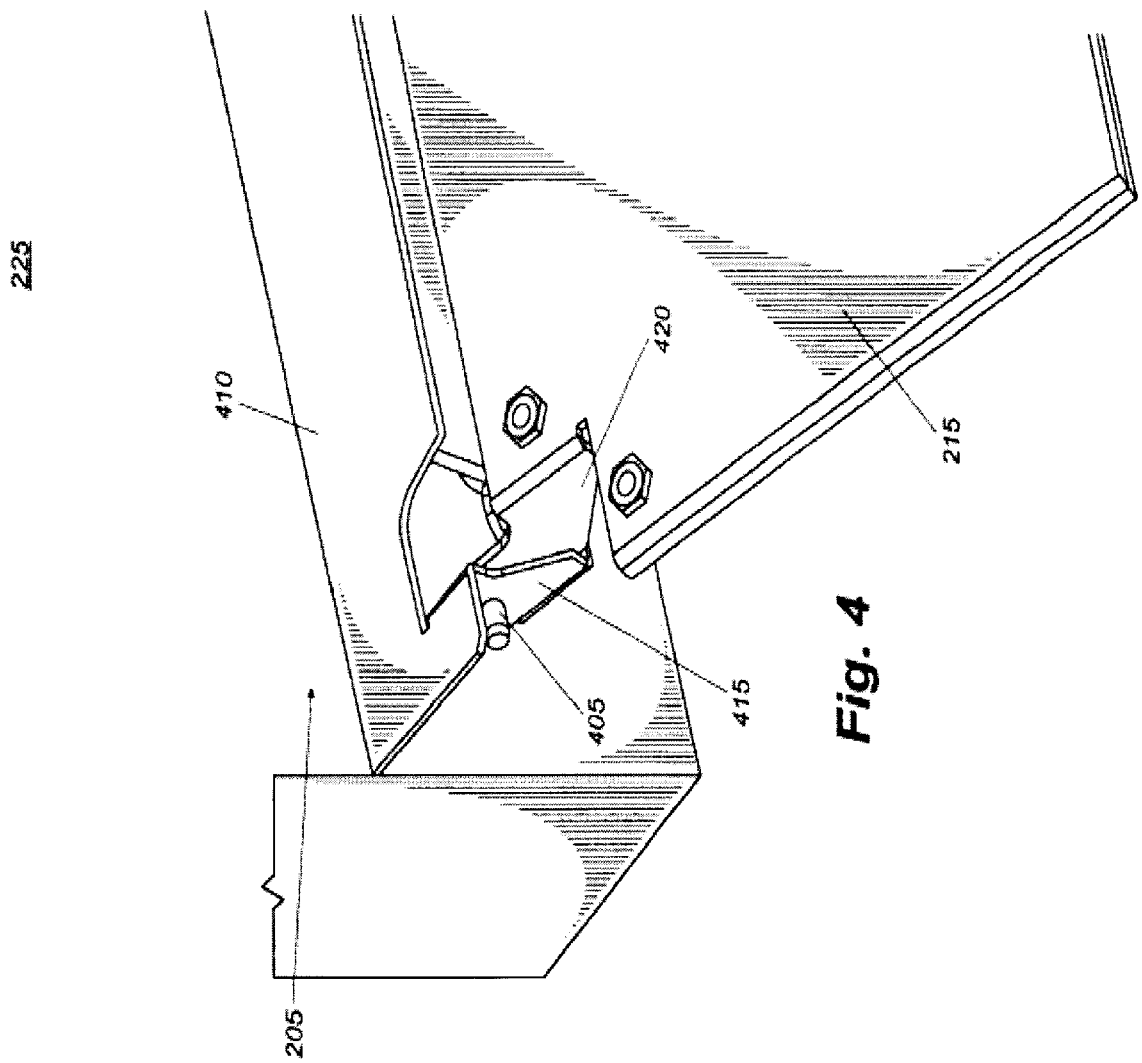
FIG. 4 shows the detailed hinge and hinge stop of the divider of FIGS. 2 and 3 in accordance with the present invention.

FIG. 4 shows a detailed view of the hinge 225 that is used in a first embodiment of the present invention. FIG. 4 shows the divider 215 in the open position, thereby allowing access to the lower section 205 of the module. A pivot pin 405, such as a screw or smooth pin, couples the divider 215 to a stabilizing bar 410, which can be formed, for example, from a separate piece of sheet metal. The stabilizing bar 410 is mechanically coupled to the inside of the module housing, for example, by a press-fit or by screws. In this embodiment of the present invention, the stabilizing bar 410 runs the length of the divider 215 for additional stability and to provide additional shielding to further section the housing.

Figure 5:
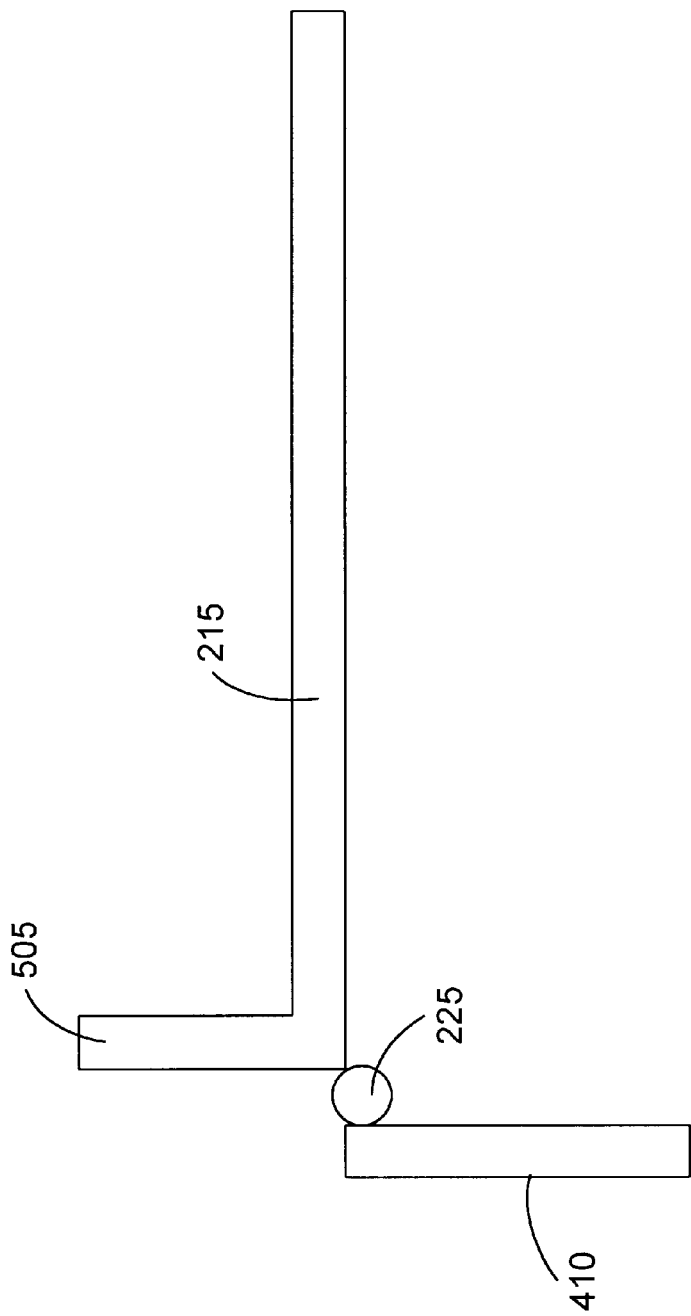
FIG. 5 is a side view of the divider in accordance with the present invention.

FIG. 5 shows a detailed side view of the divider 215 in an embodiment of the present invention. In FIG. 5, the divider 215 includes a formed element 505 for example, a ninety-degree angle to the planar surface, mounted or formed onto the hinged side of the divider 215. Such an element 505 could rest upon the stabilizing bar 410, if used, when the divider 215 is in the open position to provide greater mechanical integrity. In this manner, heavier boards and components can be mounted onto the topside of the divider 215 without deforming the divider 215 or damaging the hinges 220 when the divider 215 is opened. The angle is positioned outward, or upward, so when the divider 215 is opened, the angle element 505 will provide routing for cable harnesses within the housing and be able rest upon the bar 405.

Formed into or mounted onto the stabilizing bar 410 is a hinge stop 415, which is essentially in the shape of a ninety-degree angle that is cut out from the stabilizing bar 410 and bent into position. The hinge stop 415 supports a flange 420 that is also cut out of the divider 215 and bent into shape. When the flange 420 is supported within the hinge stop 415, the divider 215 is then prevented from over-extending. It will be appreciated that there are other methods of hinges and stops available to essentially accomplish the same means of stopping the divider 215 from over-extending. The embodiment shown of the hinge 220 in FIG. 4 is not intended to limit or restrict the usage of other hinge and over-extension stop designs.

Advantageously, the module 200 (FIG. 2) in accordance with the present invention can be manufactured to include boards or components situated within the lower portion 205. The divider 215 can be pivoted to the seated position, and more components added to the module 200 within the upper portion 210. An embodiment of the present invention saves time and money within the manufacturing organization due to its ease in designing to prevent interference or noise, the capability of densely packaging electronics and boards within the module 200, and eases the process of assembly and test by allowing access to substantially all components. In addition, another advantage to the present invention is the repair and service of the module after manufacturing. If required, technicians have easy access to lower boards and components without having to disassemble daughterboards or other components that may have been soldered or connected to the lower boards.

What is claimed is:

1. An electronic module, comprising:
    a housing; and
    a divider that is substantially conductive, rectangular, and planar, and that is hingeably coupled to said housing, wherein the divider defines an upper section and a lower section within the housing, and
    wherein the divider, in an open position, allows access to electronics within the lower section, and the divider, in a closed position, allows access to electronics within the upper section, and when in the closed position, provides electromagnetic shielding between the electronics in the upper section and the electronics in the lower section.

2. The electronic module of claim 1, further comprising:
    hinges coupled between the divider and the housing, thereby allowing the divider within the housing to be rotated between the open position and the closed position.

3. The electronic module of claim 2, wherein the hinges further comprise:
    at least two sections on one side of the divider that are each cut out of the divider and each bent to a perpendicular plane of the divider, wherein the sections comprise:
    an aperture for each coupling a pin to the housing.

4. The electronic module of claim 1, wherein the housing further comprises:
    walls for defining an interior, and the divider is hingeably coupled to one of the walls, thereby sectioning the interior into the lower and upper sections.

5. The electronic module of claim 1, wherein the electronic module is a transmitter.

6. The electronic module of claim 1, wherein the divider is made from metal.

7. A communications system for transmitting and receiving information, the communication system comprising:
    an electronic module for processing information, the electronic module comprising:
    a housing; and
    a divider that is substantially conductive, rectangular, and planar, and that is hingeably coupled to said housing,
    wherein the divider defines an upper section and a lower section within the housing, and
    wherein the divider, in an open position, allows access to electronics within the lower section, and the divider, in a closed position, allows access to electronics within the upper section, and when in the closed position, provides electromagnetic shielding between the electronics in the upper section and the electronics in the lower section.

* * * * *